US010027431B2

(12) United States Patent
Martinez Diez

(10) Patent No.: US 10,027,431 B2
(45) Date of Patent: Jul. 17, 2018

(54) BROADCAST RECEIVER WITH TWO UNITS FOR SWITCHING OVER BETWEEN DIFFERENT TRANSMISSION TECHNOLOGIES

(71) Applicant: Continental Automotive GmbH, Hannover (DE)

(72) Inventor: Saul Martinez Diez, Lahnau (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 15/536,847

(22) PCT Filed: Dec. 10, 2015

(86) PCT No.: PCT/EP2015/079252
§ 371 (c)(1),
(2) Date: Jun. 16, 2017

(87) PCT Pub. No.: WO2016/096601
PCT Pub. Date: Jun. 23, 2016

(65) Prior Publication Data
US 2017/0353251 A1 Dec. 7, 2017

(30) Foreign Application Priority Data
Dec. 16, 2014 (DE) .......... 10 2014 226 139

(51) Int. Cl.
*H04H 20/22* (2008.01)
*H04B 1/40* (2015.01)
(Continued)

(52) U.S. Cl.
CPC ............ *H04H 20/22* (2013.01); *H03G 5/025* (2013.01); *H04B 1/406* (2013.01); *H04B 7/02* (2013.01);
(Continued)

(58) Field of Classification Search
CPC .... H04H 20/22; H04H 20/62; H04H 2201/13; H04H 20/26; H04H 20/426;
(Continued)

(56) References Cited

U.S. PATENT DOCUMENTS 5,584,051 A 12/1996 Goeken
6,711,390 B1 * 3/2004 Moers .................. H03J 1/0083
455/161.2
(Continued)

FOREIGN PATENT DOCUMENTS

DE 102012012272 A1 1/2013
DE 102013015161 A1 3/2015
(Continued)

OTHER PUBLICATIONS

International Search Report and Written Opinion dated Mar. 7, 2016 from corresponding International Patent Application No. PCT/EP2015/079252.

(Continued)

*Primary Examiner* — Philip Sobutka

(57) ABSTRACT

The invention relates to a method for receiving radio broadcast signals by means of a radio broadcast receiver and to a radio broadcast receiver designed for performing the method, wherein the broadcast receiver has at least two receiving units for different transmission techniques. The user selects a radio broadcast service of a first receiving unit of the at least two receiving units, and the selected radio broadcast service is then played back by the radio broadcast receiver. The other, second receiving unit for the different transmission technique of the radio broadcast receiver searches for an alternative radio broadcast service having preferably the same or comparable content during the playback of the radio broadcast service selected by the user, and the radio broadcast receiver automatically switches over to the second receiving unit having the alternative radio broad- (Continued)

cast service if the first receiving unit cannot play back the selected radio broadcast service.

12 Claims, 1 Drawing Sheet

(51) Int. Cl.
    *H04B 7/08*     (2006.01)
    *H04H 60/41*     (2008.01)
    *H03G 5/02*     (2006.01)
    *H04B 7/02*     (2018.01)
    *H04B 1/403*     (2015.01)

(52) U.S. Cl.
    CPC ............. *H04B 7/08* (2013.01); *H04B 7/0888* (2013.01); *H04H 60/41* (2013.01); *H04H 2201/60* (2013.01)

(58) Field of Classification Search
    CPC .... H04N 21/4622; H04B 1/406; H04B 7/082; H04B 7/02; H04B 7/22; H04B 7/08; H04B 7/0882; H04B 7/0888
    USPC ....... 455/185.1, 186.1, 3.01, 3.04, 101, 132, 455/133, 134, 135, 62, 161.2, 166.2
    See application file for complete search history.

(56) References Cited

U.S. PATENT DOCUMENTS

| | | | |
|---|---|---|---|
| 6,721,018 B1 | 4/2004 | Shintani et al. | |
| 7,072,685 B2 * | 7/2006 | Yamanishi | H04B 1/005 348/E5.097 |
| 7,088,740 B1 * | 8/2006 | Schmidt | H04H 20/22 370/343 |
| 7,376,402 B2 * | 5/2008 | Lecomte | H04H 20/26 455/142 |
| 9,236,961 B2 * | 1/2016 | Zhu | H04H 20/26 |
| 2003/0196211 A1 | 10/2003 | Chan | |
| 2007/0143816 A1 * | 6/2007 | Gupta | H04H 60/46 725/135 |
| 2008/0139109 A1 | 6/2008 | Ewertz | |
| 2008/0311940 A1 * | 12/2008 | Uppala | H03J 1/0075 455/509 |
| 2009/0275299 A1 * | 11/2009 | Buch | H04H 20/22 455/161.1 |
| 2011/0294455 A1 | 12/2011 | Kawano | |
| 2015/0079916 A1 | 3/2015 | Wolf et al. | |
| 2016/0211980 A1 * | 7/2016 | Zhu | H04W 4/06 |

FOREIGN PATENT DOCUMENTS

EP     2091164 B1     6/2013
EP     2713534 A1     4/2014

OTHER PUBLICATIONS

English Translation of Abstract of DE 102013015161 A1.
English Translation of Abstract of DE 102012012272 A1.
English Translation of Claimsof DE 102012012272 A1.
English Translation of Description of DE 102012012272 A1.

* cited by examiner

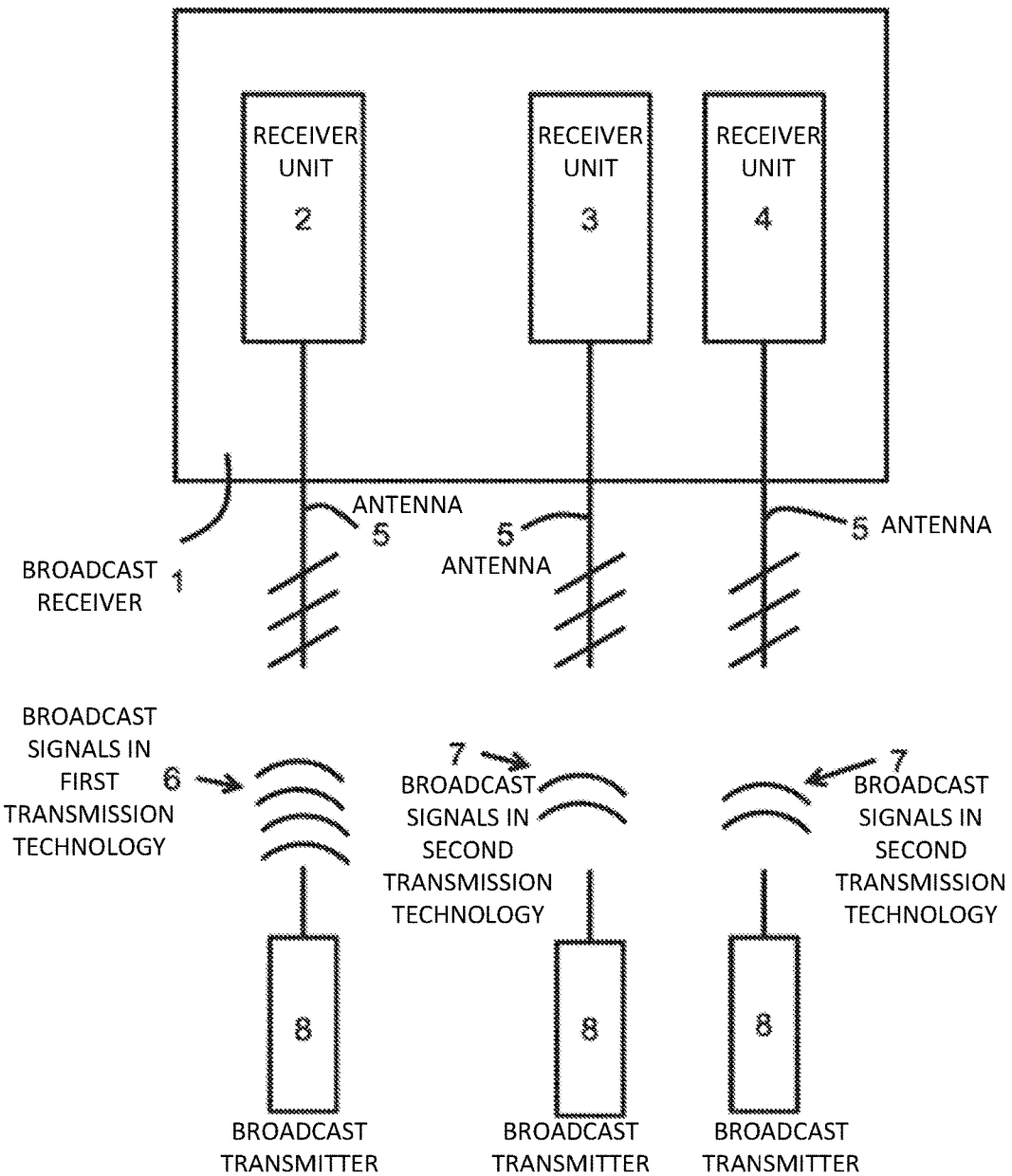

BROADCAST RECEIVER WITH TWO UNITS FOR SWITCHING OVER BETWEEN DIFFERENT TRANSMISSION TECHNOLOGIES

BACKGROUND

The invention relates to a method for receiving broadcast signals by means of a broadcast receiver that has at least two receiver units for different transmission technologies. The different transmission technologies may be VHF/FM radio, AM radio, DRM radio (Digital Radio Mondiale), DAB radio (Digital Audio Broadcasting), DVB (Digital Video Broadcasting) and/or other transmission technologies. In the method, the user selects a broadcast service of a first receiver unit of the at least two receiver units, with the selected broadcast service then being reproduced by the broadcast receiver. The invention also relates to a broadcast receiver that has two receiver units for different transmission technologies and is designed to implement the method.

It is common in broadcast receivers that user actions performed on the operating unit of a broadcast receiver impacts immediately on the actions being performed by the receiver unit. During a user action in which demands are made on a receiver unit, the reproduction of a broadcast signal is usually stopped until the user action is accomplished. For instance during a band-scan, which is meant to determine and list the reproducible broadcast signals, an interruption of several seconds can thus occur in the reproduction of the broadcast signal, which the user notices clearly. Such a video-output pause or audio mute from the broadcast receiver arises from the conventional approach to user operation in which the controls and display elements of the apparatus assign the user action directly or indirectly to a receiver unit. It is thus predetermined which receiver unit of a broadcast technology is addressed, whereas the receiver unit for other broadcast and/or transmission technologies is usually not involved or occupied in the execution of user actions.

Some known solutions intended to avoid this problem equip the broadcast receiver with two receiver units for the same broadcast technology, so that user actions can be performed in the background while the broadcast signal is received by the other receiver unit and reproduced by the broadcast receiver. This involves considerable costs especially for digital transmission technology because the receiver units for digital transmission technologies are still expensive.

Thus the object of the present invention is to interrupt as briefly as possible the reproduction of the selected broadcast service during user actions and/or automatically performed functions that access a receiver unit of the broadcast receiver. Automatically performed functions are functions that access a receiver unit of the broadcast receiver and are executed by the broadcast receiver, either self-initiated or as a result of a request from a control unit.

BRIEF SUMMARY

This object is achieved by the method of the type mentioned in the introduction having the features of claim 1. This method provides that while the first receiver unit is being used to reproduce the broadcast service selected by the user, the other, second receiver unit of the broadcast receiver, which unit is for the transmission technology that differs from the first receiver unit, seeks an alternative broadcast service having preferably the same or comparable content, and that the broadcast receiver automatically switches over to the second receiver unit having the alternative broadcast service when the first receiver unit cannot reproduce the selected broadcast service.

A broadcast service within the meaning of the invention may be in particular the selection of a broadcast channel for reproduction. This includes both audio and video channels. As a general rule, however, broadcast services can also involve, in addition to reproducing a radio or television program, receiving any data, such as other information, for instance, which is preferably transmitted as a broadcast and received by the broadcast receiver by means of its receiver unit, and then reproduced. An example of an information service is the retrieval of program information about the radio or television program currently running. Specific examples of the use of an information service are the electronic program guide (EPG), traffic information (TPEG) or similar data services that are handled via a broadcast service and delivered by grouping data in specific frequency bands or over the entire frequency spectrum. The implementation of these data services in particular constitutes added value for the user, whether used for providing information directly via a suitable human machine interface (HMI), for instance a display, or for transmitting information in the background to control units, which information is then used by the control units.

As a rule, such a service is intended to be performed in parallel with the reproduction of the existing broadcast service. This applies in particular when there is an intended channel change. In this case, it is possible according to the invention to switch over readily between the two receiver units without the user noticing or being distracted by the change between the broadcast services. It is thereby possible that the originally selected first receiver unit for reproducing the selected broadcast service undertakes other functions while the broadcast channel selected originally by the user continues to be reproduced with the same content but by a different broadcast service in a different transmission technology. The at least one second receiver unit in the other (second) transmission technology thus constitutes from the user's viewpoint a sort of virtual receiver unit that can simulate, if necessary, reception by the first (selected) receiver unit.

It is hence provided according to the invention that in the event of a user action that requires the use of the selected receiver unit, the broadcast receiver automatically switches over to the other receiver unit having the alternative broadcast service before the output from the first receiver unit stops and the reproduction of the broadcast service is interrupted. In addition, it is possible while the user action is even being executed in the selected receiver unit that the alternative receiver unit can anticipate with a shorter response time the output of audio and/or video signals and can output said signals in advance, in particular for the case that the actually selected first receiver unit is not ready yet for the output. After the user action has finished and the associated release of the selected first receiver unit, the output can then be switched back automatically to the selected (first) receiver unit.

Since in a conventional broadcast receiver, a selected (first) receiver unit is always tied up by the broadcast reproduction, in particular an audio reproduction, on the selected frequency of the transmission technology, it is possible by virtue of the other (second) receiver units of a different transmission technology to continue to reproduce the original broadcast signal, in particular the audio reproduction, while the first receiver unit performs other functions. The first receiver unit is thus released by the one or more second receiver units from reproducing the selected broadcast service in order to perform other functions (which are offered by other broadcast services in the first transmission technology). It is thereby possible to expand considerably the functionality of the broadcast receiver having just one first receiver unit (which is usually more complex and more expensive) and to offer, in particular in parallel with an audio reproduction of a broadcast service, broadcast services that normally can be offered only by broadcast receivers having at least two receiver units for this transmission technology.

In this context, the second receiver units thus constitute a form of virtual receiver unit.

This is explained in greater detail below with reference to preferred embodiments.

Thus in the method proposed according to the invention, it can be provided that a user action that accesses the first receiver unit is the reason for there being no capability to reproduce the selected broadcast service. The current broadcast service, for example the reproduction thereof, is usually impaired or even terminated by this access. User actions in particular are selecting a new broadcast service, performing a band-scan to locate all receivable broadcast services or searching for additional program information or data in alternative broadcast signals and/or at alternative frequencies in the relevant transmission technology.

Another reason for there being no capability to reproduce the selected broadcast service can be that data is being received by means of another broadcast service, in particular at alternative frequencies in the relevant transmission technology. This can be actuated by a user action or by a background action, for instance of the broadcast receiver or a connected control unit, for example in a motor vehicle. In a preferred embodiment, it is the case in particular that data is received by means of the transmission technology of the first receiver unit and thus data reception must be carried out by the first receiver unit.

If the user action and/or the action to receive data is and/or requires the selection of a new broadcast service, it can be proposed according to the invention that after the user action or the action, the broadcast receiver switches over to the second receiver unit and reproduces the alternative broadcast service, which, according to the invention, has the same or comparable content to the originally selected broadcast service. The first receiver unit then seeks the new broadcast service, and the broadcast receiver switches over or back to the first receiver unit once this receiver unit is receiving the new broadcast service. The new broadcast service is subsequently reproduced by the broadcast receiver using the first (actually selected) receiver unit.

An alternative embodiment of the present invention provides that the user action and/or the action to receive data is and/or requires the selection of a new broadcast service, for example in the form of a new radio channel. After the user action and/or the action to receive data, the second receiver unit seeks the new broadcast service. During this time, the originally selected broadcast service continues to be received by the first receiving unit and is reproduced by the broadcast receiver. Once the second receiver unit is receiving the new broadcast service, the broadcast receiver switches over to the second receiver unit and reproduces the new broadcast service. After the switchover to the second receiver unit, the first receiver unit seeks the new broadcast service. The broadcast receiver switches over or back to the first receiver unit once this unit is receiving the new broadcast service. Then the broadcast receiver uses the first receiver unit to receive the new broadcast service and reproduces said service. This is particularly suitable for the case where the first receiver uses a digital transmission technology, which when tuning to a new broadcast service usually takes longer until the signal can be reproduced than traditional receiver units for an analog transmission technology, which in the radio sector in particular is still available in parallel.

A preferred variant of the method proposed according to the invention provides that more than two receiver units are provided, wherein the more than two receiver units are suitable for a total of at least two transmission technologies.

Often the first receiver unit is intended for digital transmission technologies (e.g. DAB), and a plurality of second receiver units are intended for an analog transmission technology (e.g. FM), because analog receiver units in the radio sector are significantly cheaper than digital receiver units. The user, however, will usually choose as the first receiver unit the digital receiver unit, which offers a better reception quality and also more information within the transmitted signal.

According to an exemplary embodiment, the two or more second receiver units are used also to implement a phase diversity technique, in which in order to increase the quality of the reproduction, the reproduction of the broadcast signal is composed from two receive signals i.e. two differently received broadcast signals of identical content. Said phase diversity technique is generally known for FM reception and can be applied particularly preferably as part of this invention in order to adjust in particular an audio reproduction signal from the plurality of second receiver units to match the quality of the audio reproduction signal from the one first receiver unit, for example a digital receiver unit for DAB reception. This technique is generally known and therefore need not be described in greater detail here.

It is also particularly advantageous if, during reproduction of the broadcast service received by the first receiver unit, a plurality of second receiver units seek alternative broadcast services of an ensemble of broadcast services, wherein an ensemble of broadcast services comprises a plurality of different broadcast services (in particular audio and/or data services) that are transmitted by a broadcast transmitter in a broadcast signal. These can then be simultaneously decoded and reproduced by the receiver unit. Such ensembles are usually transmitted via digital transmission technology and received by the first receiver unit. A plurality of second receiver units then seek different broadcast services of the broadcast services from the ensemble in the analog transmission technology. An example of such an ensemble may be, for instance, the various radio channels from a broadcast transmitter.

If there are insufficient receiver units available for all the broadcast services, the broadcast services sought by the second receiver units are selected on the basis of the probability of their selection by the user. It can accordingly be provided according to the invention that the plurality of second receiver units first seek the selected broadcast service of the first receiver unit and then seek additional broadcast services according to the probability of their selection. The probability can be determined, for example, by means of a user behavior that is ascertained and saved by the broadcast receiver or by means of a program content index.

In this context, it can also be provided as part of the proposed method that the broadcast receiver ascertains, for example by a channel-scan and/or on the basis of known digital or analog transmission frequencies, which broadcast services, on selection of a seek function, are arranged adjacent to the selected broadcast service in the radio channel of the transmission technology of the first receiver unit, and that the plurality of second receiver units seek these adjacently arranged broadcast services. In the case of a seek function, these services can then be reproduced immediately by the broadcast receiver by switching over to the relevant second receiver unit.

In addition to the user actions already described, according to the invention another reason for there being no capability to reproduce the selected broadcast service may be the loss of the radio signal. In this case, by switching over to the second receiver unit, the signal can initially be reproduced until the first receiver unit has found another source for the same program content, if applicable, or the user has been informed that the first receiver unit is unable to continue to reproduce the selected content at the desired quality.

According to the invention, the proposed method can preferably be used for a broadcast receiver operated in a vehicle, in particular in a motor vehicle. In this case there are often changing reception qualities that involve user actions. Thus the advantage of the invention is particularly evident in this context.

According to the invention, alignment of the broadcast services from the first and second receiver units before switching over between the two receiver units can be performed in a manner known per se and thus not described in greater technical detail here by correlating the audio and volume signal. This technology is also referred to as a seamless function and is used to perform audio transitions between two broadcasting technologies as unobtrusively as possible.

The invention also relates to a broadcast receiver having the features of claim 12. For the purpose of reproducing a receivable broadcast signal, this broadcast receiver is equipped with a first receiver unit for a first transmission technology and a second receiver unit for a second transmission technology, which is different from the first transmission technology. The broadcast receiver also comprises a processing unit, wherein the processing unit is designed to select the broadcast signal from a receiver unit according to a user selection and to reproduce said signal at an audio and/or video output. According to the invention, the processing unit is also designed to implement some or all of the method described above.

Preferably, the first receiver unit can be designed for a digital transmission technology, and the second receiver unit for an analog transmission technology. If applicable, additional receiver units can also be provided that implement more than two transmission technologies in the broadcast receiver.

Furthermore, a plurality of first and/or second (or additional) receiver units can be provided, a plurality of which in each case offer the same transmission technology.

Further advantages, features and possible uses of the present invention also appear in the following description of an exemplary embodiment and in the drawing. All the features described and/or depicted therein constitute individually or in combination the subject matter of the present invention irrespective of how they are combined in the claims or the dependency references thereof.

BRIEF DESCRIPTION OF THE DRAWINGS

FIG. 1 shows schematically a broadcast receiver according to embodiments of the invention.

DETAILED DESCRIPTION

In this regard, the single FIG. 1 shows schematically a broadcast receiver according to the invention having a first receiver unit and two second receiver units according to a preferred embodiment.

The broadcast receiver 1 has a first receiver unit 2 and two second receiver units 3, 4. In the example shown, each of the receiver units 2, 3, 4 comprises an antenna 5 for receiving broadcast signals. The invention, however, is not limited to the case in which each receiver unit 2, 3, 4 has a dedicated antenna. It is also possible to provide all the receiver units 2, 3, 4 with a shared antenna, for instance having an antenna splitter, in order to feed the various broadcast signals to the different receivers 2, 3, 4.

The first receiver unit 2 is suitable for receiving broadcast signals 6 in a first transmission technology. The second receiver units 3, 4 are designed to receive broadcast signals 7 in a second transmission technology. The broadcast signals 6, 7 are each transmitted by suitable broadcast transmitters 8.

The broadcast receiver 1 also comprises a processing unit (not shown), which is designed to implement the following method variant, for example. In this method variant it is assumed that the first receiver unit 2 is a receiver unit for receiving digital broadcast signals from a DAB broadcast and the two second receiver units 3, 4 are intended to receive an analog FM broadcast.

The starting point for the method in each case is that the user has received a DAB service as the broadcast service, which is received by the first receiver unit 2 and reproduced by the broadcast receiver 1. While this is taking place, the second receiver unit 3 seeks an alternative FM broadcast service that is broadcasting identical content.

In a first example application of the method proposed according to the invention, the user decides to perform a DAB band-scan in order to find the broadcast signals 6 or broadcast transmitters 8 that can be received under the first transmission technology. Before the DAB band-scan using the first receiver unit 2 is started, the broadcast receiver switches over the audio output from the first receiver unit 2 (DAB receiver unit) to the second receiver unit 3 (FM receiver unit), which was tuned in advance to the applicable service alternative and has selected a broadcast service containing broadcast signals 7 in the second transmission technology, which has the same content as the broadcast service in the first transmission technology. Thus it appears to the user that the originally selected broadcast service continues to be output unchanged even though actually an alternative broadcast service in a different transmission technology has been selected.

Only after this point does the first receiver unit start to perform the DAB band-scan. During this time, the previous reproduction signal is thus still heard via the second receiver unit 3.

Only once the DAB band-scan has finished does the broadcast receiver 1 switch back again automatically from the second receiver unit 3 to the first receiver unit 2, which then receives once again the original broadcast service. This service is then output by the broadcast receiver 1.

In a second example application of the method according to the invention, the user decides to select a different DAB broadcast service, either from a preset or from a service list provided to the user, which list may be, for instance, the result of the DAB band-scan described previously. Before the retuning of the first receiver unit (DAB receiver unit) is started, the audio output from the broadcast receiver 1 is switched from the first receiver unit 2 to the second receiver unit 3 (FM receiver unit), which was tuned in advance to the applicable service alternative. During the retuning of the first receiver unit 2, which involves the processes of frequency selection, ensemble decoding, audio service selection and audio component decoding, the broadcast signal can be received and heard via the second receiver unit 3. Only once the first receiver unit 2 is able to supply the new broadcast service does the broadcast receiver 1 switch back automatically from the second receiver unit 3 to the first receiver unit 2. The user thereafter hears the newly selected DAB service via the first receiver unit 2.

The previously described embodiment can be combined with an additional embodiment variant, in which the additional second receiver unit 4 seeks the same service that the user has selected for the first receiver unit 2 as the newly selected DAB audio service. Since the response time of the second receiver unit 4 as an FM receiver unit is usually shorter than the response time of the first receiver unit 2 as a DAB receiver unit, in an alternative variant, the alternative second receiver unit 4 can output the newly selected broadcast service already during the tuning process of the first receiver unit 2. Only once the first receiver unit 2 is able to supply the newly selected DAB broadcast service does the broadcast receiver 1 switch back automatically from the second receiver unit 4 to the first receiver unit 2, which then receives and outputs via the broadcast receiver 1 the newly selected DAB broadcast service.

In another variant for implementing the method according to the invention, the user decides to seek a nearest ensemble of broadcast services (either upwards or downwards in frequency). Before the search run of the first receiver unit 2 (DAB receiver unit) is started, the audio output is changed from the first receiver unit 2 to the second receiver unit 3, which was tuned in advance to the applicable service alternative. During the entire ensemble search process by the first receiver unit 2, the previously selected broadcast signal can be heard by means of the alternative broadcast service of the second receiver unit 3. Only once the first receiver unit 2 is able to supply the new audio data from the newly selected DAB broadcast service does the broadcast receiver 1 switch back automatically from the second receiver unit 3 to the first receiver unit 2, with the result that the newly selected broadcast service of the other ensemble can be heard.

Similar to a case already described previously above, this embodiment can also be implemented in an embodiment variant in which the additional second receiver unit 4 seeks the broadcast service that is expected to be the most probable result of the ensemble search. This assessment is performed in real time as a query to a database of the receivable ensembles or of the known broadcast DAB frequencies and their contents.

If the user now decides to seek the nearest ensemble of broadcast services (either upwards or downwards in frequency), the second receiver unit 4 can seek and tune to the expected broadcast service. Before this search run by the DAB receiver is finished, the expected broadcast service can be played out via the second receiver unit 4 as an FM broadcast signal.

Even in the case in which a probability of a change in transmitter by the user is ranked as high, the receive signal from the second receiver unit 4 can be buffered in order to synchronize the audio data from the second receiver unit 4 with the audio data from the first receiver unit 2. This audio data can be played out, for example, only once the first receiver unit 2 (DAB receiver unit) has minimized the risk of a different result during the transmitter search run and hence has validated the original assessment.

During all or some of the running time of the ensemble search process, the signal reproduced by the second receiver unit 4 can be heard initially. Only once the first receiver unit 2 is able to supply the new audio data from the newly selected broadcast service does the broadcast receiver 1 switch back automatically from the second receiver unit 4 to the audio output of the first receiver unit 2, with the result that the broadcast receiver 1 emits the selected DAB broadcast signal of the broadcast service.

The invention claimed is:

1. A method for receiving broadcast signals by means of a broadcast receiver that has at least two receiver units for different transmission technologies, in which the user selects a first broadcast service to be received by means of a first receiver unit of the at least two receiver units, and in which the selected first broadcast service is then reproduced by the broadcast receiver, wherein the other, second receiver unit for the different transmission technology of the broadcast receiver is ready to receive alternative broadcast services having the same or comparable content, characterized in that the broadcast receiver automatically switches over at least temporarily to the second receiver unit having the alternative broadcast service when the first receiver unit cannot reproduce the selected broadcast service as a result of a user action that accesses the first receiver unit and impairs or deselects the reproduction of the previously selected broadcast service, or as a result of the first receiver unit receiving data by means of another broadcast service;
   wherein the user action and/or the action to receive data is and/or requires the selection of a new broadcast service, and wherein after the user action and/or the action to receive data, the broadcast receiver switches over to the second receiver unit and reproduces the alternative broadcast service, wherein the first receiver unit seeks the new broadcast service, and wherein the broadcast receiver switches over to the first receiver unit once this receiver unit is receiving the new broadcast service;
   wherein the user action and/or the action to receive data is and/or requires the selection of a new broadcast service, and wherein the second receiver unit seeks the new broadcast service, wherein the broadcast receiver switches over to the second receiver unit once this receiver unit is receiving the new broadcast service, and reproduces the new broadcast service, wherein after the switchover to the second receiver unit, the first receiver unit seeks the new broadcast service, and wherein the broadcast receiver switches over to the first receiver unit once this unit is receiving the new broadcast service;
   wherein more than two receiver units are provided, wherein the more than two receiver units are suitable for a total of at least two transmission technologies; and
   wherein more than two receiver units for a transmission technology are used to implement a phase diversity technique, in which in order to increase the quality of the reproduction, the reproduction of the broadcast signal is composed from two receive signals.

2. The method as claimed in claim 1, characterized in that during reproduction of the broadcast service received by the first receiver unit, a plurality of second receiver units seek alternative broadcast services of an ensemble of broadcast services, wherein an ensemble of broadcast services comprises a plurality of different broadcast services that are transmitted by a broadcast transmitter in a broadcast signal.

3. The method as claimed in claim 2, characterized in that the plurality of second receiver units first seek the selected broadcast service and then seek additional broadcast services in the order of the probability of said services being selected.

4. The method as claimed in claim 3, characterized in that that the broadcast receiver ascertains which broadcast services, on selection of a seek function by the user, are arranged adjacent to the selected broadcast service in the radio channel of the transmission technology of the first receiver unit, and in that the plurality of second receiver units seek these broadcast services as alternative broadcast services.

5. The method as claimed in claim 4, characterized in that alignment of the broadcast services from the first and second receiver units before switching over between the two receiver units is performed by correlating the audio and volume signal.

6. A broadcast receiver for reproducing a received broadcast signal and comprising at least one first receiver unit for a first transmission technology and at least one second receiver unit for a second transmission technology, which is different from the first transmission technology, and comprising a processing unit, wherein the processing unit is designed to select the broadcast signal from a receiver unit according to a user selection and to reproduce said signal, characterized in that the processing unit is also designed to perform operations comprising:

causing the broadcast receiver to automatically switch over at least temporarily to the at least one second receiver unit having an alternative broadcast service when the first receiver unit cannot reproduce the selected broadcast service as a result of a user action that accesses the first receiver unit and impairs or deselects the reproduction of the previously selected broadcast service, or as a result of the first receiver unit receiving data by means of another broadcast service;

wherein the user action and/or the action to receive data is and/or requires the selection of a new broadcast service, and wherein after the user action and/or the action to receive data, the broadcast receiver switches over to the second receiver unit and reproduces the alternative broadcast service, wherein the first receiver unit seeks the new broadcast service, and wherein the broadcast receiver switches over to the first receiver unit once this receiver unit is receiving the new broadcast service;

wherein the user action and/or the action to receive data is and/or requires the selection of a new broadcast service, and wherein the second receiver unit seeks the new broadcast service, wherein the broadcast receiver switches over to the second receiver unit once this receiver unit is receiving the new broadcast service, and reproduces the new broadcast service, wherein after the switchover to the second receiver unit, the first receiver unit seeks the new broadcast service, and wherein the broadcast receiver switches over to the first receiver unit once this unit is receiving the new broadcast service;

wherein more than two receiver units are provided, wherein the more than two receiver units are suitable for a total of at least two transmission technologies; and wherein more than two receiver units for a transmission technology are used to implement a phase diversity technique, in which in order to increase the quality of the reproduction, the reproduction of the broadcast signal is composed from two receive signals.

7. The broadcast receiver as claimed in claim 6, characterized in that the first receiver unit is designed for a digital transmission technology, and the second receiver unit for an analog transmission technology.

8. The broadcast receiver as claimed in claim 7, characterized in that a plurality of first and/or second receiver units are provided.

9. The broadcast receiver as claimed in claim 6, characterized in that during reproduction of the broadcast service received by the first receiver unit, a plurality of second receiver units seek alternative broadcast services of an ensemble of broadcast services, wherein an ensemble of broadcast services comprises a plurality of different broadcast services that are transmitted by a broadcast transmitter in a broadcast signal.

10. The broadcast receiver as claimed in claim 9, characterized in that the plurality of second receiver units first seek the selected broadcast service and then seek additional broadcast services in the order of the probability of said services being selected.

11. The broadcast receiver as claimed in claim 10, characterized in that that the broadcast receiver ascertains which broadcast services, on selection of a seek function by the user, are arranged adjacent to the selected broadcast service in the radio channel of the transmission technology of the first receiver unit, and in that the plurality of second receiver units seek these broadcast services as alternative broadcast services.

12. The broadcast receiver as claimed in claim 11, characterized in that alignment of the broadcast services from the first and second receiver units before switching over between the two receiver units is performed by correlating the audio and volume signal.

* * * * *